United States Patent
An et al.

(10) Patent No.: US 12,537,498 B2
(45) Date of Patent: Jan. 27, 2026

(54) FILTER INCLUDING AT LEAST ONE INDUCTOR-CAPACITOR STRUCTURE FORMED IN A MULTI-LAYER SUBSTRATE AND METHOD FOR MANUFACTURING THE FILTER

(71) Applicants: Beijing BOE Optoelectronics Technology Co., Ltd., Beijing (CN); BOE Technology Group Co., Ltd., Beijing (CN)

(72) Inventors: Qichang An, Beijing (CN); Yuelei Xiao, Beijing (CN); Yue Li, Beijing (CN); Yifan Wu, Beijing (CN); Kidong Han, Beijing (CN); Xue Cao, Beijing (CN); Wenbo Chang, Beijing (CN); Huiying Li, Beijing (CN); Lihui Wang, Beijing (CN); Yanfei Ren, Beijing (CN); Qiuxu Wei, Beijing (CN); Yulin Feng, Beijing (CN); Biqi Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 283 days.

(21) Appl. No.: 18/027,211

(22) PCT Filed: Jun. 24, 2022

(86) PCT No.: PCT/CN2022/101018
§ 371 (c)(1),
(2) Date: Mar. 20, 2023

(87) PCT Pub. No.: WO2023/245593
PCT Pub. Date: Dec. 28, 2023

(65) Prior Publication Data
US 2024/0313735 A1 Sep. 19, 2024

(51) Int. Cl.
*H03H 7/01* (2006.01)
*H03H 1/00* (2006.01)

(52) U.S. Cl.
CPC ... *H03H 7/0115* (2013.01); *H03H 2001/0085* (2013.01)

(58) Field of Classification Search
CPC .................................................. H03H 7/0115
(Continued)

(56) References Cited

U.S. PATENT DOCUMENTS

| | | | | |
|---|---|---|---|---|
| 2003/0030994 A1* | 2/2003 | Takaya et al. | ...... | H01F 17/0006 361/728 |
| 2004/0113721 A1* | 6/2004 | Bhatia et al. | ...... | H01L 23/15 257/E23.009 |

FOREIGN PATENT DOCUMENTS

| | | | |
|---|---|---|---|
| CN | 105308862 A | 2/2016 | |
| CN | 106409758 A | 2/2017 | |

(Continued)

*Primary Examiner* — Benny T Lee
(74) *Attorney, Agent, or Firm* — Nath, Goldberg & Meyer; Joshua B. Goldberg

(57) ABSTRACT

A filter and a method for manufacturing a filter are provided and belong to the field of electronics technology. The method includes forming at least one inductor and at least one capacitor. Forming the at least one inductor includes: providing a first dielectric substrate; the first dielectric substrate includes a first surface and a second surface opposite to each other along a thickness direction thereof; forming first sub-structures of the inductor on the first surface; forming first connection vias penetrating through the first dielectric substrate in the thickness direction thereof; forming first connection electrodes in the first connection vias; and forming second sub-structures of the inductor on the second surface; the first connection electrodes sequentially connects the first and second sub-struc- (Continued)

tures through the first connection vias to form a coil structure of the inductor.

16 Claims, 7 Drawing Sheets

(58) Field of Classification Search
USPC .......................................................... 333/185
See application file for complete search history.

(56) References Cited

FOREIGN PATENT DOCUMENTS

| | | |
|---|---|---|
| CN | 106795044 A | 5/2017 |
| CN | 111816608 A | 10/2020 |
| CN | 112312654 A | 2/2021 |
| CN | 113990858 A | 1/2022 |
| CN | 114070222 A | 2/2022 |
| CN | 114094977 A | 2/2022 |
| CN | 114520222 A | 5/2022 |
| IN | 112335037 A | 2/2021 |
| JP | 2011166620 A | 8/2011 |
| TW | 201929156 A | 7/2019 |

* cited by examiner

FILTER INCLUDING AT LEAST ONE INDUCTOR-CAPACITOR STRUCTURE FORMED IN A MULTI-LAYER SUBSTRATE AND METHOD FOR MANUFACTURING THE FILTER

CROSS-REFERENCE TO RELATED APPLICATION

This is a National Phase Application filed under 35 U.S.C. 371 as a national stage of PCT/CN2022/101018, filed Jun. 24, 2022, the content of which is hereby incorporated by reference in its entirety.

TECHNICAL FIELD

The present disclosure relates to the field of electronics technology, and in particular to a filter and a method for manufacturing a filter.

BACKGROUND

Nowadays, the consumer electronics industry changes with each passing day, mobile communication terminals represented by mobile phones, particularly 5G mobile phones, are developing rapidly, the more and more frequency bands of signals are processed by the mobile phones, the required radio frequency chips are more and more, and the mobile phones are developing continuously towards a form enjoyed by consumers, including miniaturization, lightweight and long battery life. In a traditional mobile phone, a large number of discrete devices, such as resistors, capacitors, inductors, filters and the like, are provided on a radio frequency PCB, and the discrete devices have the defects of large volume, high power consumption, multiple welding spots and large parasitic parameter change, and thus are difficult to meet future requirements. The interconnection, matching or the like among the radio frequency chips are required to be implemented by integrated passive devices with small area, high performance and good consistency. The integrated passive devices currently on the market are mainly Si (silicon) based substrates and GaAs (gallium arsenide) based substrates. The Si-based integrated passive device has the advantages of low price, but has a high microwave loss due to the fact that Si has trace impurities (poor insulation). Thus, the Si-based integrated passive device has the general performance. The GaAs-based integrated passive device has the excellent performance, but is expensive.

SUMMARY OF THE INVENTION

The present disclosure is directed to at least one of the technical problems in the prior art, and provides a filter and a method for manufacturing a filter.

The technical solution adopted to solve the technical problem of the present disclosure is a method for manufacturing a filter, including steps of forming at least one inductor and at least one capacitor; wherein the step of forming the at least one inductor includes: providing a first dielectric substrate; wherein the first dielectric substrate includes a first surface and a second surface opposite to each other along a thickness direction of the first dielectric substrate; forming first sub-structures of the inductor on the first surface of the first dielectric substrate; forming first connection vias penetrating through the first dielectric substrate in the thickness direction of the first dielectric substrate; forming first connection electrodes in the first connection vias; and forming second sub-structures of each of the at least one inductor on the second surface of the first dielectric substrate; wherein the first connection electrodes sequentially connects the first sub-structures and the second sub-structures through the first connection vias to form a coil structure of the inductor.

In some embodiments, the first dielectric substrate is processed by any one of a sand blast method, a photosensitive glass method, a focus discharge method, a plasma etching method, a laser ablation method, an electrochemical method or a laser induced etching method for forming the first connection vias.

In some embodiments, the step of forming first connection electrodes in the first connection vias includes: forming a first conductive film layer in the first connection vias as a first seed layer; and electroplating the first seed layer to form the first connection electrodes filled in the first connection vias. Here, the seed layer indicates a film layer, which is positioned between a substrate and a metal layer, and has a function to improve an adhesion between the substrate and the metal layer, thereby enhancing a growth of the metal layer on the substrate. In the fields of microelectronics and semiconductors, seed layers are commonly used to prepare metal circuits and electrodes.

In some embodiments, the first seed layer covers the second surface of the first dielectric substrate; and after the step of electroplating the first seed layer to form the first connection electrodes filled in the first connection vias, the method further includes: patterning the electroplated first seed layer on the second surface to form the second sub-structures.

In some embodiments, the step of forming first connection electrodes in the first connection vias includes: forming a first conductive film layer in the first connection vias as a first seed layer; and electroplating the first seed layer to form the first connection electrodes covering inner walls of the first connection vias; wherein the first connection electrodes cover the inner walls of the first connection vias to define first accommodation spaces.

In some embodiments, before the step of forming second sub-structures of the inductor on the second surface of the first dielectric substrate, the method further includes: forming filling structures to fill the first accommodation spaces, respectively.

In some embodiments, the first seed layer covers the second surface of the first dielectric substrate; and after the step of electroplating the first seed layer to form the first connection electrodes filled in the first connection vias, the method further includes: patterning the electroplated first seed layer on the second surface to form the second sub-structures.

In some embodiments, the step of forming second sub-structures of the inductor on the second surface of the first dielectric substrate includes: forming a second conductive film layer on the second surface of the first dielectric substrate as a second seed layer; electroplating the second seed layer to increase a thickness of the first conductive film layer; and patterning the electroplated second seed layer to form the second sub-structures.

In some embodiments, a first plate of each of the at least one capacitor is formed while forming the first sub-structures of the inductor.

In some embodiments, the method further includes: forming a first interlayer dielectric layer on a side of the first sub-structures of the inductor and the first plate of the capacitor away from the first dielectric substrate; and forming a pattern including a second plate of the capacitor on a side of the first interlayer dielectric layer away from the first dielectric substrate through a patterning process.

In some embodiments, the step of forming a pattern including a second plate of the capacitor on a side of the first interlayer dielectric layer away from the first dielectric substrate through a patterning process includes: sequentially depositing a fourth film layer, a fifth film layer and a sixth film layer on a side of the first interlayer dielectric layer away from the first dielectric substrate, and forming the second plate of the capacitor through the patterning process such that the second plate includes a seventh portion, an eighth portion and a ninth portion stacked sequentially.

In some embodiments, the method further includes: forming a second interlayer dielectric layer on a side of the second plate of the capacitor away from the first dielectric substrate, and forming a second connection via penetrating through the first interlayer dielectric layer and the second interlayer dielectric layer and a third connection via penetrating through the second interlayer dielectric layer; and forming a second connection electrode and a third connection electrode on a side of the second interlayer dielectric layer away from the first dielectric substrate, through a patterning process; wherein the second connection electrode is connected to a lead terminal of the inductor through the second connection via; and the third connection electrode is electrically connected to the second plate of the capacitor through the third connection via.

In some embodiments, the method further includes: sequentially forming a first protective layer and a first planarization layer on a side of the second connection electrode and the third connection electrode away from the first dielectric substrate; forming a fourth connection via and a fifth connection via penetrating through the first protective layer and the first planarization layer; and forming a first connection pad and a second connection pad; wherein the first connection pad is connected to the second connection electrode through the four connection via, and the second connection pad is connected to the third connection electrode through the fifth connection via.

In some embodiments, the first planarization layer, the fourth connection via, the fifth connection via, the first connection pad, and the second connection pad are all formed after the second sub-structures of the inductor are formed.

In some embodiments, the method further includes: sequentially forming a second protective layer and a second planarization layer on a side of the second sub-structures away from the first dielectric substrate.

In some embodiments, the step of forming first sub-structures of the inductor on the first surface of the first dielectric substrate includes: sequentially depositing a first film layer, a second film layer and a third film layer on the first surface of the first dielectric substrate, and forming the first sub-structures through a patterning process such that each of the first sub-structures includes a first portion, a second portion and a third portion stacked sequentially.

In some embodiments, a distance between any two adjacent first connection vias is not less than twice a diameter of each first connection via.

The embodiment of the present disclosure further provides a filter, including at least one inductor and at least one capacitor integrated on a first dielectric substrate; wherein the first dielectric substrate includes first connection vias penetrating through the first dielectric substrate in a thickness direction of the first dielectric substrate; and the first dielectric substrate includes a first surface and a second surface opposite to each other in the thickness direction of the first dielectric substrate; and each of the at least one inductor includes a first sub-structures on the first surface and second sub-structures on the second surface and the first connection electrodes within the first connection vias; and the first sub-structures are connected to the second sub-structures through the first connection electrodes to form a coil structure of the inductor.

In some embodiments, the first connection electrodes cover inner walls of the first connection vias to define first accommodation spaces within the first connection vias.

In some embodiments, the first accommodation spaces are filled with filling structures, respectively.

In some embodiments, the first connection electrodes and the second sub-structures have a one-piece structure.

In some embodiments, the first connection electrodes fill the first connection vias.

DETAIL DESCRIPTION OF THE EMBODIMENTS

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
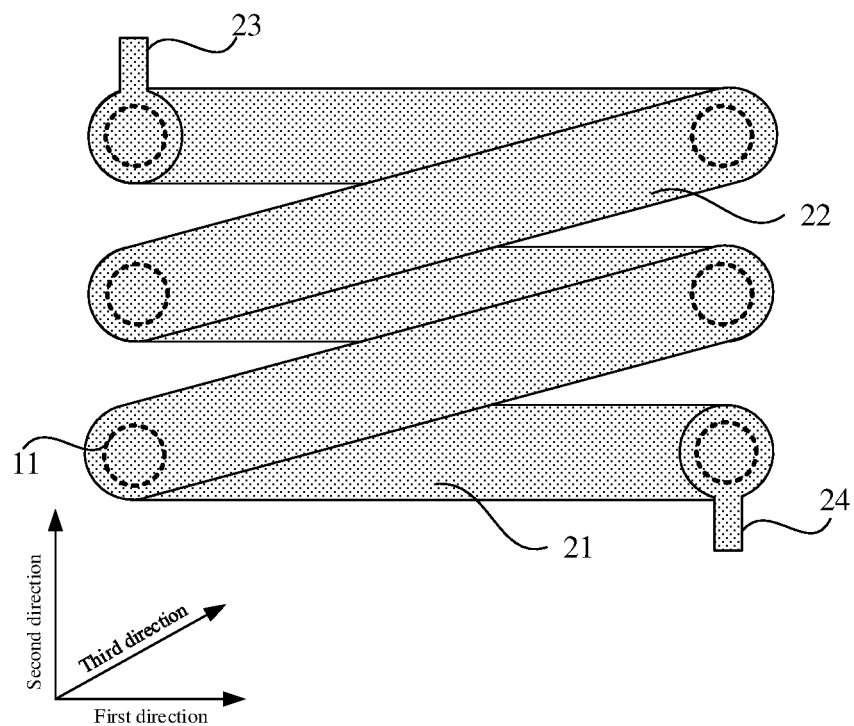
FIG. 1 is a top view of an inductor according to an embodiment of the present disclosure.

FIG. 1 is a top view of an inductor according to an embodiment of the present disclosure. Referring to FIG. 1, the inductor includes first sub-structures 21 extending along a first direction and arranged side by side along a second direction; second sub-structures 22 extending in a third direction and arranged side by side in the second direction. The first direction, the second direction and the third direction are different from each other. In the embodiment of the present disclosure, as an example, the first direction and the second direction are perpendicular to each other, and the first direction and the third direction intersect with each other and are non-perpendicular to each other for description. Alternatively, the extending directions of the first sub-structures 21 and the second sub-structures 22 may be interchanged with each other, which is also within the protection scope of the embodiments of the present disclosure. In addition, in the present embodiment, as an example, the inductor includes N first sub-structures 21 and N-1 second sub-structures 22 for description, where N≥2, and N is an integer. Orthographic projections of a first terminal and a second terminal of each first sub-structure 21 on the first dielectric substrate at least partially overlap with orthographic projections of two first connection vias 11 on the first dielectric substrate, respectively. The first terminal and the second terminal of each first sub-structure 21 correspond to two different first connection vias 11. That is, an orthographic projection of each first sub-structure 21 on the first dielectric substrate at least partially overlap with the orthographic projections of two first connection vias 11 on the first dielectric substrate. At this time, a first terminal of the ith second sub-structure 22 of the inductor is connected to the first terminal of the ith first sub-structure 21 and the second terminal of the (i+1)th first sub-structure 21 to form an inductor coil, where 1≤i≤N-1, and i is an integer.

It should be noted that a first lead terminal 24 is connected to a second terminal of the 1st first sub-structure 21 of the inductor coil, and a second lead terminal 23 is connected to a first terminal of the Nth first sub-structure 21. Further, the first lead terminal 24 and the second lead terminal 23 and the second sub-structures 22 may be disposed in the same layer and made of the same material. At this time, the first lead terminal 24 may be connected to the second terminal of the 1st first sub-structure 21 through a first connection via 11, and correspondingly, the second lead terminal 23 may be connected to the first terminal of the Nth first sub-structure 21 through a first connection via 11.

Figure 2:
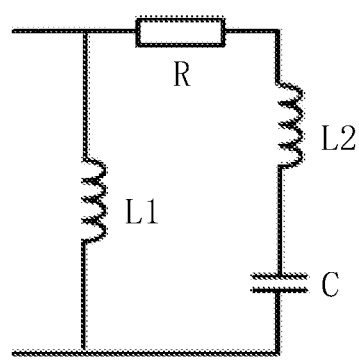
FIG. 2 is a schematic diagram of a filter circuit.

FIG. 2 is a schematic diagram of a filter circuit. As shown in FIG. 2, the filter circuit includes two inductors, one capacitor and one resistor. For convenience of understanding, the two inductors are referred to as a first inductor L1 and a second inductor L2, respectively. With continued reference to FIG. 2, a first lead terminal of the first inductor L1 is connected to a first terminal of the resistor R, a second lead terminal of the first inductor is connected to a second plate of the capacitor C, a first lead terminal of the second inductor L2 is connected to a second terminal of the resistor R, and a second lead terminal of the second inductor L2 is connected to a first plate of the capacitor C.

It should be noted that the resistor R may be implemented by a wire, or a high-resistance material, such as indium tin oxide (ITO) or nickel chromium (NiCr) alloy. In the embodiment of the present disclosure, the material of the resistor R is not limited. The capacitor and the inductors will be mainly described below.

Figure 3:
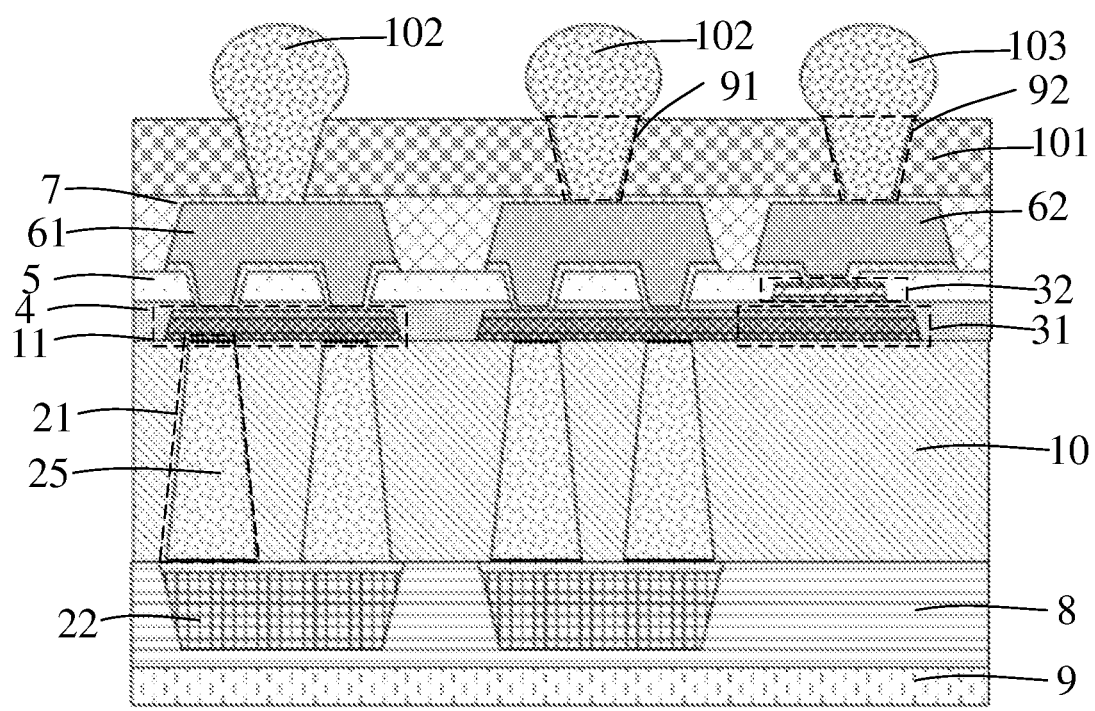
FIG. 3 is a cross-sectional view of a filter according to an embodiment of the present disclosure.

FIG. 3 is a cross-sectional view of a filter according to an embodiment of the present disclosure. As shown in FIG. 3, the filter is formed by integrating the filter circuit shown in FIG. 2 on the first dielectric substrate 10, the first dielectric substrate 10 includes a first surface and a second surface which are oppositely arranged along a thickness direction of the first dielectric substrate, and the first dielectric substrate 10 is provided with first connection vias 11 penetrating through the thickness direction of the first dielectric substrate; first connection electrodes 25 of the inductor coil are formed in the first connection vias 11, the first sub-structures 21 of the inductor coil are formed on the first surface of the first dielectric substrate 10, and the second sub-structures 22 of the inductor coil are formed on the second surface of the first dielectric substrate 10. The first dielectric substrate 10 in the embodiment of the present disclosure includes, but is not limited to, any one of a glass substrate, a flexible substrate, and an interlayer dielectric layer including at least an organic insulating layer. The first dielectric substrate 10 in the embodiment of the present disclosure is preferably a glass substrate, because passive devices are integrated on the glass substrate, which has the advantages of small volume, light weight, high performance, low power consumption, and the like. Hereinafter, as an example, the first dielectric substrate 10 is the glass substrate.

With continued reference to FIG. 3, in some examples, the first plate 31 of the capacitor is disposed on the first surface and in the same layer as the first sub-structures 21 of the inductor coil, a first interlayer dielectric layer 4 is disposed on a side of the first plate 31 of the capacitor away from the first dielectric substrate 10, and the second plate 32 of the capacitor is disposed on a side of the first interlayer dielectric layer 4 away from the first plate 31 of the capacitor; a second interlayer dielectric layer 5 is arranged on a side of the second plate 32 of the capacitor away from the first dielectric substrate 10; a second connection electrode 61 and a third connection electrode 62 are arranged on a side of the second interlayer dielectric layer 5 away from the first dielectric substrate 10; and the second connection electrode 61 is connected to the first sub-structure 21 of the second inductor through second connection vias penetrating through the first interlayer dielectric layer 4 and the second interlayer dielectric layer 5; the third connection electrode 62 is connected to the second plate 32 of the capacitor through third connection vias penetrating through the second interlayer dielectric layer 5. A first protective layer 7 and a first planarization layer 101 are sequentially arranged on a side of the second connection electrode 61 and the third connection electrode 62 away from the first dielectric substrate 10; and a fourth connection via 91 and a fifth connection via 92 are formed penetrating through the first protective layer 7 and the first planarization layer 101. A first connection pad 102 and a second connection pad 103 are formed in the fourth connection via 91 and the fifth connection via 92, respectively. The first connection pad 102 and the second connection pad 103 may be of solder.

With continued reference to FIG. 3, a second protective layer 8 and a second planarization layer 9 may be formed on a side of the second sub-structures 22 away from the first dielectric substrate 10 to protect the second sub-structures 22 from water-oxygen attack.

In some examples, the first connection electrode 25 within the first connection via 11 covers only an inner wall of the first connection via 11, rather than filling up the first connection via 11.

Further, when the first connection electrode 25 covers only the inner wall of the first connection via 11, a first accommodation space located within the first connection via is defined, and at this time, a resin material may be filled in the first accommodation space as a filling structure 26 (for example, see FIG. 10), which prevents the first connection electrodes 25 from being oxidized and plays a role of support.

In some examples, the first connection electrodes 25 and the second sub-structures 22 of the inductor may have a one-piece structure, i.e. may be formed in one patterning process. Thus, the process steps can be reduced, and the production cost can be reduced.

The structural parameters of the devices of the filter according to the embodiment of the present disclosure are explained one by one in the following manufacturing method, and thus will not be described in detail here.

Referring to FIG. 3, an embodiment of the present disclosure provides a method for manufacturing a filter, where the filter may be the above filter, and the method for manufacturing a filter may include:

Providing a first dielectric substrate 10; the dielectric substrate includes a first surface and a second surface which are oppositely arranged along the thickness direction of the first dielectric substrate.

The first dielectric substrate 10 includes, but is not limited to, a glass substrate. In some examples, a thickness of the first dielectric substrate 10 is in a range from about 0.25 mm to about 0.3 mm.

Forming the first sub-structure 21 of the inductor on the first surface of the first dielectric substrate 10.

Figure 5:
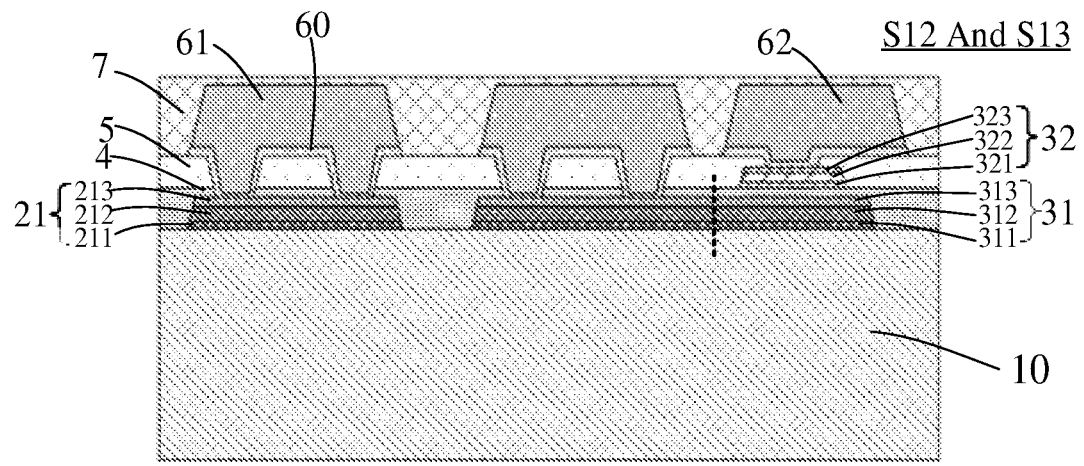
FIG. 5 is a schematic diagram of an intermediate product formed in steps S12 and S13 of a first example of a method for manufacturing a filter according to an embodiment of the present disclosure.

In some examples, the step of forming the first sub-structure 21 may form a pattern including the first sub-structure 21 using a patterning process. For example: as shown in FIG. 5, the first sub-structure 21 includes a first portion 211, a second portion 212 and a third portion 213, which are sequentially stacked on the first surface of the first dielectric substrate 10. The step of forming the first sub-structure 21 includes: sequentially depositing a first film layer, a second film layer and a third film layer on the first surface of the first dielectric substrate 10 through a process including, but not limited to, a magnetron sputtering process, coating photoresist, performing exposure and development processes, performing a wet etching process, and finally stripping off the photoresist (strip), thereby forming the first sub-structure 21 including the first portion 211, the second portion 212 and the third portion 213.

The first film layer may be a molybdenum (Mo) and nickel (Ni) alloy layer, and has a thickness in a range of about 0.03 µm to about 0.05 µm; the second film layer may be a copper (Cu) layer with a thickness in a range of about 0.3 µm to about 0.5 µm; the third film layer may be a Mo and Ni alloy layer, and has a thickness in a range of about 0.02 µm to about 0.05 µm. In the first sub-structures 21 formed by the first, second and third film layers, the first portions 211 and the third portions 213 can protect the second portions 212, so as to prevent the second portions 212 from being oxidized in the transfer and other process change.

After step of forming the first sub-structure 21, turning over the first dielectric substrate 10 to form the first connection vias 11 penetrating through the first dielectric substrate 10 in the thickness direction of the first dielectric substrate 10.

In some examples, a sand blast method, a photosensitive glass method, a focus discharge method, a plasma etching method, a laser ablation method, an electrochemical method, a laser induced etching method, or the like may be employed for forming the first connection vias 11.

Forming the first connection electrodes 25 in the first connection vias 11.

In some examples, the step of forming the first connection electrodes 25 in the first connection vias 11 may include forming a first conductive film layer as a first seed layer on the second surface of the first dielectric substrate 10 on which the first connection vias 11 are formed, and then electroplating the first seed layer to form the first connection electrodes 25 positioned within the first connection vias 11.

Forming second sub-structures 22 of the inductor on the second surface of the first dielectric substrate 10; the first connection electrodes 25 sequentially connects the first sub-structures 21 and the second sub-structures 22 through the first connection vias 11 to form a coil structure of the inductor.

In some examples, the second sub-structures 22 of the inductor may be formed after the first connection electrodes 25 are formed. A second conductive film layer is formed on the second surface of the first dielectric substrate 10 as a second seed layer, and then the second seed layer is electroplated to increase the thickness of the first conductive film layer; finally, the electroplated second seed layer is patterned, so as to form the second sub-structures 22.

Alternatively, the second sub-structures 22 may be formed by patterning the electroplated first conductive film layer on the second surface in the step of forming the first connection electrodes 25 in the first connection vias 11, and the second sub-structures 22 and the first connection electrodes 25 may be formed in a single process.

It should be noted that only the process of forming the inductor in the filter is given above, that is, only a part of the steps of manufacturing a filter are given, and the method for manufacturing a filter may further include the step of forming other devices such as the capacitor, which will be described in detail in following examples.

In the embodiment of the present disclosure, the first connection vias 11 in the first dielectric substrate 10 are formed after the first sub-structures 21 of the inductor are formed, and compared with a case in the prior art that the first connection vias 11 are formed and then other film layers on the first dielectric substrate 10 are formed, in the embodiment of the present disclosure, during the preparation process, the number of times of the temperature change of the film layers, through which the first connection vias 11 penetrate, can be effectively reduced, thereby reducing the probability of abnormal conductivity occurring in the first sub-structures 21 of the first inductor.

In order to better understand the method for manufacturing a filter in the embodiments of the present disclosure, the following description is made with reference to specific examples.

In a first example, the method for manufacturing a filter specifically includes the following steps.

Figure 4:
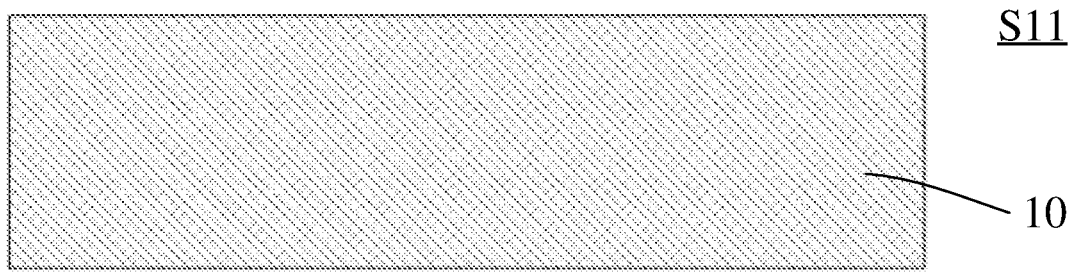
FIG. 4 is a schematic diagram of an intermediate product formed in step S11 of a first example of a method for manufacturing a filter according to an embodiment of the present disclosure.

S11, providing a first dielectric substrate 10; the dielectric substrate includes a first surface and a second surface which are oppositely arranged along the thickness direction of the dielectric substrate, as shown in FIG. 4.

The first dielectric substrate 10 includes, but is not limited to, the glass substrate. In some examples, a thickness of the first dielectric substrate 10 is in a range from about 0.25 mm to about 0.3 mm, which is suitable for the first dielectric substrate 10 with a small size.

S12, forming the first sub-structures 21 of the inductor and the first plate 31 of the capacitor on the first surface of the first dielectric substrate 10, as shown in FIG. 5.

In some examples, the first sub-structures 21 include first portions 211, second portions 212 and third portions 213, which are sequentially stacked on the first surface of the first dielectric substrate 10; and the first plate 31 of the capacitor includes a fourth portion 311, a fifth portion 312, and a sixth portion 313, which are sequentially stacked on the first surface of the first dielectric substrate 10. The first portions 211 and the fourth portion 311 are disposed in the same layer and are made of the same material; the second portions 212 and the fifth portion 312 are disposed in the same layer and are made of the same material; the third portions 213 and the sixth portion 313 are disposed in the same layer and are made of the same material. Step S12 may specifically include the following steps.

Sequentially depositing a first film layer, a second film layer and a third film layer on the first surface of the first dielectric substrate 10 through a process including, but not limited to, a magnetron sputtering process; the first film layer may be a molybdenum (Mo) and nickel (Ni) alloy layer, and has a thickness in a range of about 0.03 μm to about 0.05 μm; the second film layer may be a copper (Cu) layer with a thickness in a range of about 0.3 μm to about 0.5 μm; the third film layer may be a Mo and Ni alloy layer, and has a thickness in a range of about 0.02 μm to about 0.05 μm.

Patterning the first, second and third film layers by a subtractive process to form the first sub-structure 21 of the inductor including the first, second and third portions 211, 212, 213 arranged in a stack, and the first plate 31 of the capacitor including the fourth, fifth and sixth portions 311, 312, 313 arranged in a stack. For example: a photoresist is spin-coated on a surface of the third film layer away from the first dielectric substrate 10, is exposed by using a corresponding mask; the photoresist irradiated by ultraviolet light is modified, and the development process is performed on the modified photoresist for removing the modified photoresist, copper in the region which is not protected by the photoresist is etched away by using a copper etching solution to form the first sub-structure 21 of the inductor including the first, second and third portions 211, 212, 213 arranged in a stack, and the first plate 31 of the capacitor including the fourth, fifth and sixth portions 311, 312, 313 arranged in a stack.

It should be noted that the layer where the first sub-structure 21 of the inductor and the first plate 31 of the capacitor are located is very critical in the whole device, and has the function for forming the plate of the capacitor, so that the requirement on flatness is critical, and if the electroplated thick copper is used in the above steps, it is necessary to perform the chemical mechanical planarization on the electroplated thick copper. Another function is that the first sub-structures 21 act as connection structures for the connection among TGV (through glass via) vias (first connection vias 11 as shown in FIG. 3) and the connection between the inductor and the capacitor. In order to ensure the reliability of conduction with the connection of the subsequently formed first connection electrodes 25 (FIG. 3) in the first connection vias, edges of the first sub-structures 21 exceeds edges of the first connection electrodes 25 in the first connection vias 11 by 5 μm to 10 μm.

S13, forming a first interlayer dielectric layer 4 on a side of the first sub-structure 21 of the inductor and the first plate 31 of the capacitor away from the first dielectric substrate 10, forming a pattern including a second plate 32 of the capacitor on a side of the first interlayer dielectric layer 4 away from the first dielectric substrate 10, then forming a second interlayer dielectric layer 5, forming second connection vias which penetrates through the first interlayer dielectric layer and the second interlayer dielectric layer 5, and third connection vias which penetrates through the second interlayer dielectric layer 5, then forming a second connection electrode 61 and a third connection electrode 62; wherein the second connection electrode 61 is connected to a lead terminal of the inductor through the second connection vias; the third connection electrode 62 is connected to the second plate 32 of the capacitor through the third connection vias; and finally, sequentially forming a first protective layer 7 and a first planarization layer 101 (FIG. 3) on a side of the second connection electrode 61 and the third connection electrode 62 away from the first dielectric substrate 10, as shown in FIG. 5.

In some examples, the second plate 32 of the capacitor includes a seventh portion 321, an eighth portion 322, and a ninth portion 323 stacked sequentially along a direction away from the first dielectric substrate 10, and step S13 may include the following steps.

Forming a first interlayer dielectric layer 4 on a side of the first sub-structures 21 of the inductor and the first plate 31 of the capacitor away from the first dielectric substrate 10, by adopting standard depositing processes such as Plasma Enhanced Chemical Vapor Deposition (PECVD).

A material of the first interlayer dielectric layer 4 is an inorganic insulating material. For example: the first interlayer dielectric layer 4 is an inorganic insulating layer formed of silicon nitride (SiNx), or an inorganic insulating layer formed of silicon oxide (SiO$_2$), or a plurality of stacked composite film layers including the SiNx inorganic insulating layer and the SiO$_2$ inorganic insulating layer. Alternatively, the first interlayer dielectric layer 4 also serves as an interlayer dielectric layer of the capacitor. A thickness of the first interlayer dielectric layer 4 is about 120 nm.

Sequentially depositing a fourth film layer, a fifth film layer and a sixth film layer through a process including, but not limited to, a magnetron sputtering process; spin-coating photoresist on a surface of the sixth film layer away from the first dielectric substrate 10; performing an exposure process with a corresponding mask such that the photoresist irradiated by ultraviolet light is modified; and performing a development process on the modified photoresist for removing the modified photoresist; and etching away copper in the region which is not protected by the photoresist by using a copper etching solution to form the second plate 32 of the capacitor including the seventh, eighth and ninth portions 321, 322, 323 arranged in a stack.

The fourth film layer may be a molybdenum (Mo) and nickel (Ni) alloy layer, and has a thickness in a range of about 0.03 μm to about 0.05 μm; the fifth film layer may be a copper (Cu) layer with a thickness in a range of about 0.3 μm to about 0.5 μm; the sixth film layer may be a Mo and Ni alloy layer, and has a thickness in a range of about 0.02 μm to about 0.05 μm.

Forming the second interlayer dielectric layer 5 on a side of the second plate 32 of the capacitor away from the first dielectric substrate 10, by using a standard deposition process such as PECVD, and forming, by a dry etching process, second connection vias which penetrate through the first interlayer dielectric layer 4 and the second interlayer dielectric layer 5 and third connection vias which penetrate through the second interlayer dielectric layer 5.

The second interlayer dielectric layer 5 may be made of a material which is the same as that of the first interlayer dielectric layer 4, and has a thickness in a range from 0.2 μm to 0.5 μm.

Sequentially forming a seventh film layer 60 and an eighth film layer on a side of the second interlayer dielectric layer 5 away from the first dielectric substrate 10 through a process including, but not limited to, a magnetron sputtering process; performing an electroplating process on the eighth film layer as a third seed layer, and patterning the eighth film layer, which becomes thick due to the electroplating process, and the seventh film layer 60 to form the second connection electrode 61 and the third connection electrode 62.

The seventh film layer may be a molybdenum (Mo) and nickel (Ni) alloy layer, and has a thickness in a range of about 0.03 μm to about 0.05 μm; the eighth film layer may be a copper (Cu) layer with a thickness in a range of about 0.3 μm to about 0.5 μm. The seventh film layer 60 is provided to increase the adhesion of the eighth film layer.

Forming the first protective layer 7 by adopting a standard deposition process such as PECVD.

The first protective layer 7 is used for preventing water and oxygen from corroding the device formed on the first surface of the first dielectric substrate 10. A thickness of the first protective layer 7 is in a range from 0.4 μm to 0.6 μm; a material of the first protective layer 7 may be an inorganic insulating material. For example: the first protective layer 7 is an inorganic insulating layer formed of silicon nitride (SiNx), or an inorganic insulating layer formed of silicon oxide ($SiO_2$), or a composite film of a plurality of stacked layers including the SiNx inorganic insulating layer and the $SiO_2$ inorganic insulating layer.

Figure 6:
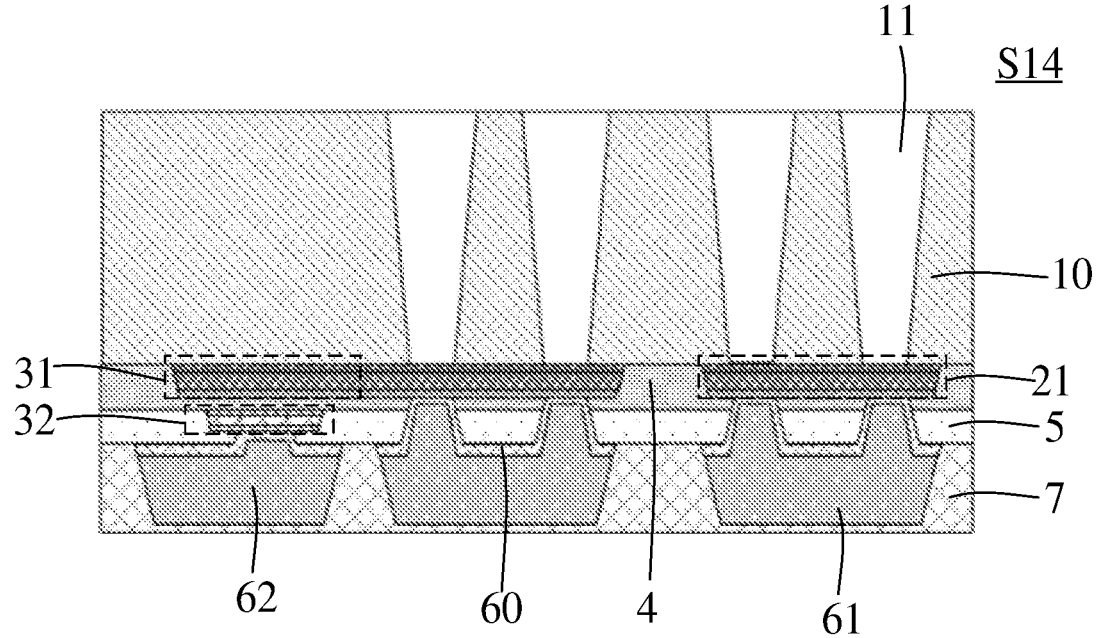
FIG. 6 is a schematic diagram of an intermediate product formed in step S14 of a first example of a method for manufacturing a filter according to an embodiment of the present disclosure.

S14, turning over the first dielectric substrate 10 to form the first connection vias 11 penetrating through the first dielectric substrate 10 in the thickness direction of the first dielectric substrate 10, as shown in FIG. 6.

In some examples, a via-last process may be performed on the first dielectric substrate 10 for forming the first connection vias 11 by using various methods, including, for example: a sand blast method, a photosensitive glass method, a focus discharge method, a plasma etching method, a laser ablation method, an electrochemical method, a laser induced etching method, or the like. Different methods have different advantages and disadvantages, and application scenarios. For example, the sand blast method is a simple process, and the first connection via 11 formed by this method has a larger aperture, so that this method is only suitable for forming the first connection via 11 with the aperture larger than 200 μm. The photosensitive glass method is a simple process and capable of forming the first connection vias 11 with high density and high aspect ratio. The focus discharge method can form the first connection via 11 rapidly. The first connection via 11 formed by the plasma etching method has a small sidewall roughness. The laser ablation method can form the first connection vias 11 with high density and high aspect ratio, but with a high roughness. The electrochemical method is low in cost, is performed by simple equipments, and can form the first connection via 11 rapidly and can form the first connection via with a larger diameter. The laser induced etching method can form the first connection via 11 rapidly, can form the first connection vias 11 with high density and high aspect ratio, and will not damage the inside of the first connection via, but with a disadvantage of using an expensive laser device. Taking the laser induced etching method as an example, the via-last process may be performed on the back side of the first dielectric substrate 10 by using the laser induced etching method. First, a laser-induced modification is performed on positions where the first connection vias 11 are to be formed by laser, and then the vias are formed by using a wet etching process. The via-last process may be performed only by adopting a single-side etching process, so that each formed via can only be an inverted cone-shaped via, and for the laser induced etching method, the inverted cone-shaped via formed by adopting the single-side etching process is typical characteristics of the first connection via 11 formed on the back side of the first dielectric substrate 10 through the via-last process. It should be noted that in order to prevent superposition of the stress regions on the sidewalls of the different first connection vias 11 from affecting the strength of the structure, the first connection vias 11 are arranged in the substrate with a pitch L between every two adjacent connection vias 11, which should be greater than or equal to two times of a diameter D of each first connection via 11, i.e., L≥2D, and the pitch cannot be too large, otherwise the substrate area is wasted, and L=2D is usually selected.

Figure 7:
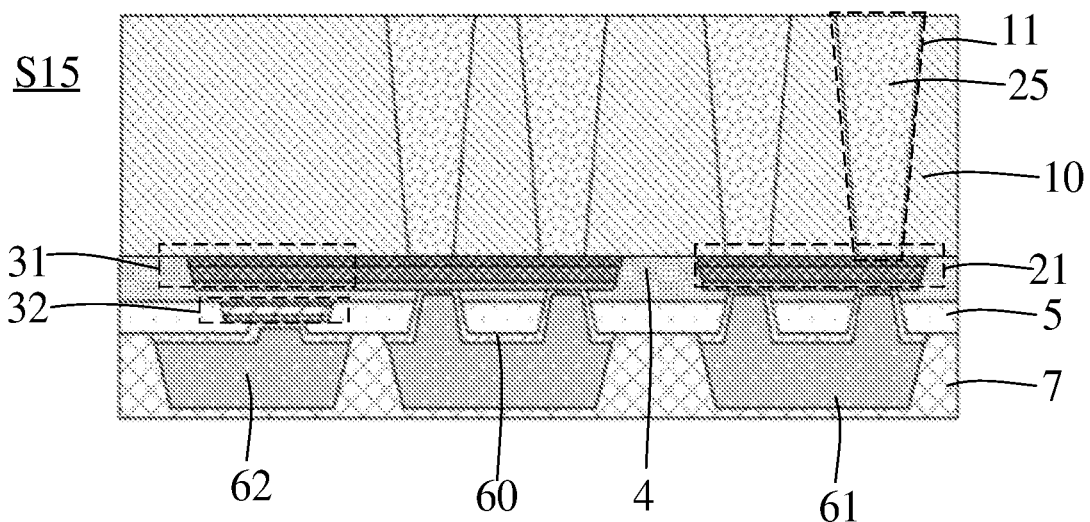
FIG. 7 is a schematic diagram of an intermediate product formed in step S15 of a first example of a method for manufacturing a filter according to an embodiment of the present disclosure.

S15, forming the first connection electrodes 25 in the first connection vias 11, as shown in FIG. 7.

In some examples, in step S15, an auxiliary film layer is formed through a process including, but not limited to, a magnetron sputtering process, and then the first conductive film layer is continuously sputtered, the first conductive film layer is used as a seed layer, the first seed layer is electroplated, and after the electroplating is completed, the excess electroplated copper on a second surface is removed by using a chemical mechanical polishing (CMP) method, thereby forming the first connection electrodes 25 for filling the first connection vias 11.

The auxiliary film layer serves to increase the adhesion of the first conductive film layer. A material of the auxiliary film layer includes, but is not limited to, titanium Ti, and a material of the first conductive film layer includes, but is not limited to, Cu. A thickness of the auxiliary film layer is in a range from about 10 nm to about 300 nm, and a thickness of the first conductive film layer is in a range from about 30 nm to about 100 nm.

Figure 8:
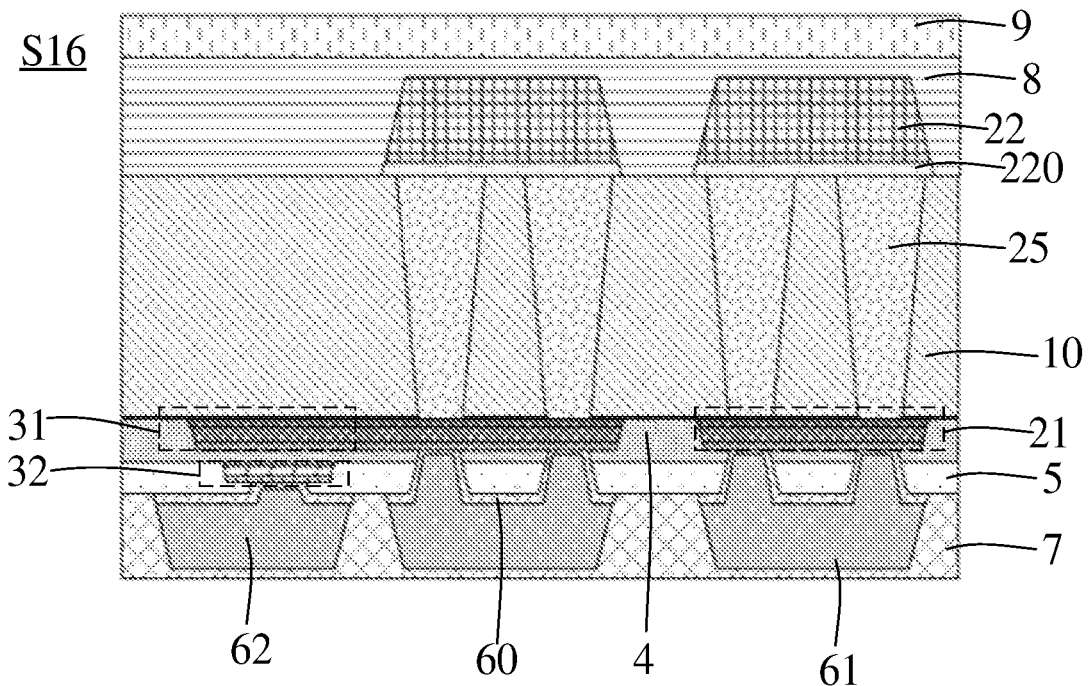
FIG. 8 is a schematic diagram of an intermediate product formed in step S16 of a first example of a method for manufacturing a filter according to an embodiment of the present disclosure.

S16, sequentially forming the second sub-structures 22 of the inductor, a second protective layer 8 and a second planarization layer 9 on the second surface of the first dielectric substrate 10 where the first connection electrodes 25 are formed, as shown in FIG. 8.

In some examples, step S16 may specifically include the following steps.

Forming a second conductive film layer 220 on the second surface of the first dielectric substrate 10 where the first connection electrodes 25 are formed through a process including, but not limited to, a magnetron sputtering process; wherein the second conductive film layer 220 is used as a second seed layer; electroplating the second seed layer; wherein a thickness of the electroplated second seed layer is usually more than 5 microns; and then patterning the electroplated second seed layer, to form the second sub-structures 22 of the inductor.

Sequentially forming the second protective layer 8 and the second planarization layer 9 by adopting standard depositing processes such as PECVD or the like.

The second protective layer 8 is used for preventing water and oxygen from corroding the devices formed on the first surface of the first dielectric substrate 10. A thickness of the second protective layer 8 is in a range from 0.4 µm to 0.6 µm; a material of the second protective layer 8 may be an inorganic insulating material. For example: the second protective layer 8 is an inorganic insulating layer formed of silicon nitride (SiNx), or an inorganic insulating layer formed of silicon oxide ($SiO_2$), or a plurality of stacked composite film layers including the SiNx inorganic insulating layer and the $SiO_2$ inorganic insulating layer.

A thickness of the second planarization layer 9 is 2 µm or more; a material of the second planarization layer 9 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

Figure 9:
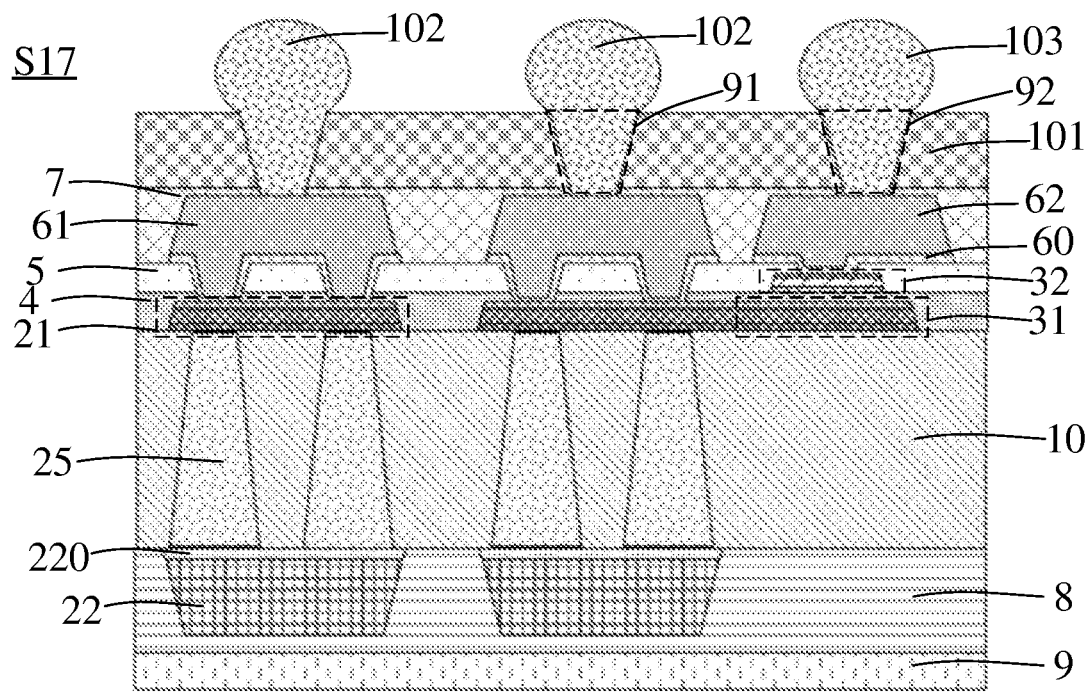
FIG. 9 is a schematic diagram of an intermediate product formed in step S17 of a first example of a method for manufacturing a filter according to an embodiment of the present disclosure.

S17, turning over the first dielectric substrate 10; forming the first planarization layer 101 on a side of the first protective layer 7 away from the first dielectric substrate 10; forming a fourth connection via 91 and a fifth connection via 92 through etching, and forming the first connection pad 102 and the second connection pad 103 respectively at positions corresponding to the fourth connection via 91 and the fifth connection via 92, as shown in FIG. 9.

A thickness of the first planarization layer 101 is 2 µm or more; a material of the first planarization layer 101 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

The first connection pad 102 and the second connection pad 103 may be solder.

Thus, the manufacturing of the filter is completed.

As a second example, the method for manufacturing a filter includes seven steps, of which four steps in the second example may be the same as steps S11 to S14 in the first example, respectively, and one step and another step S27 may be the same as steps S16 to S17 in the first example. Step S25 in the seven steps differs from step S15 in the first example in that, in step S25 of the second example, each formed first connection electrode only covers the inner wall of the corresponding first connection via 11. Thus, the first accommodation space is defined, and the filling structure 26 (FIG. 10) is formed in the first accommodation space to fill the first accommodation space. Since four steps in the second example may be the same as steps S11 to S14 in the first example, and two steps may be the same as steps S16 to S17 in the first example, the description for these steps will not be repeated, and only step S25 will be described below.

Figure 10:
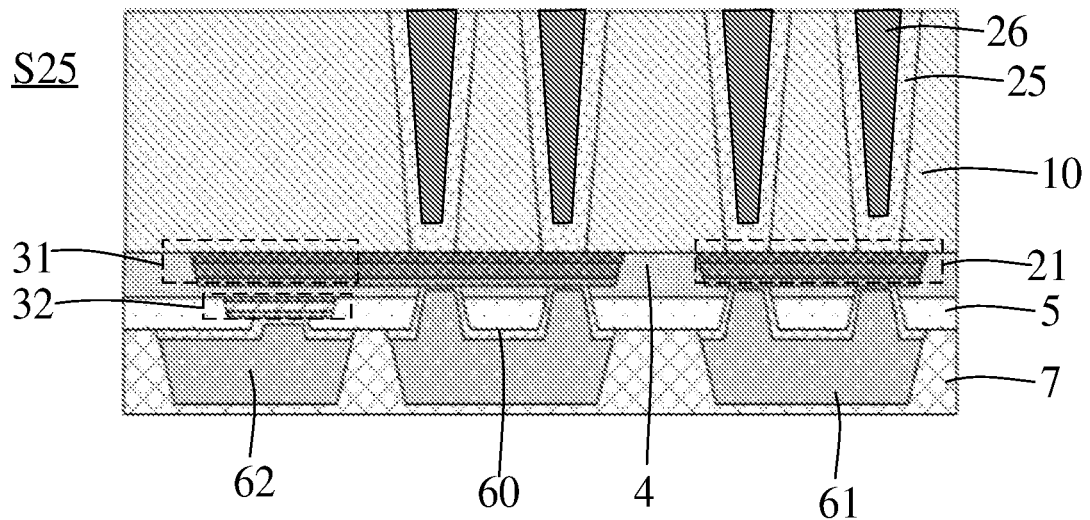
FIG. 10 is a schematic diagram of an intermediate product formed in step S25 of a second example of a method for manufacturing a filter according to an embodiment of the present disclosure.
Figure 11:
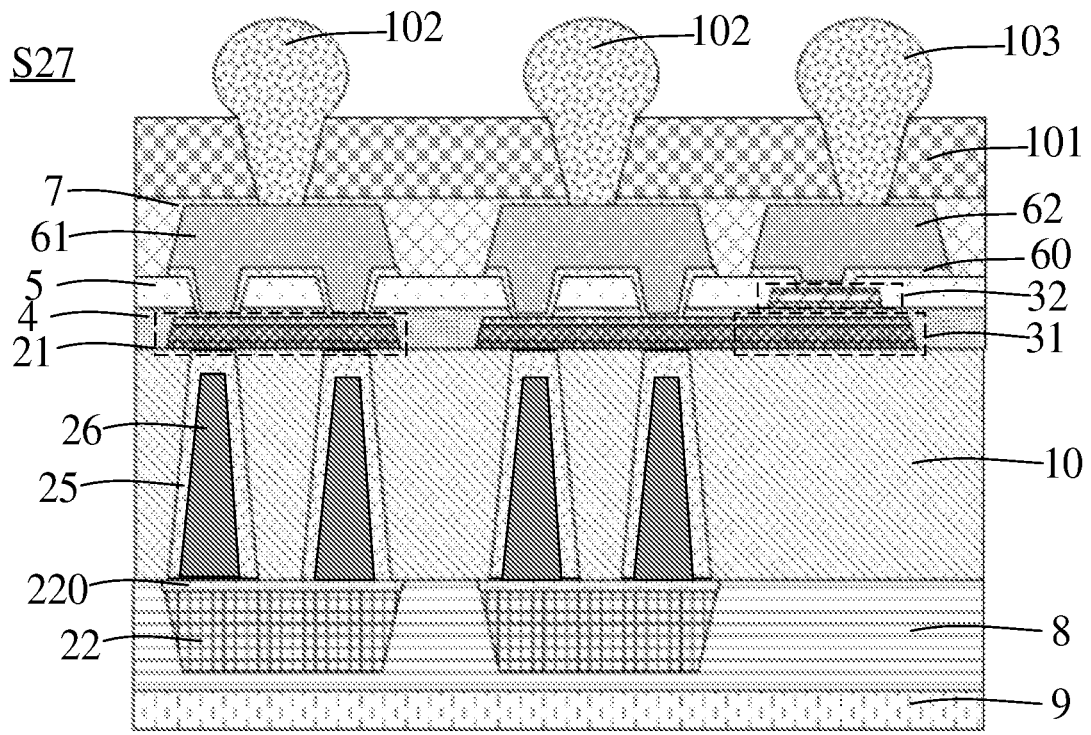
FIG. 11 is a schematic diagram of an intermediate product formed in step S27 of a second example of a method for manufacturing a filter according to an embodiment of the present disclosure.

In step S25, an auxiliary film layer is formed through a process including, but not limited to, a magnetron sputtering process, and then the first conductive film layer is continuously sputtered, the first conductive film layer is used as a seed layer, the first seed layer is electroplated, and a thickness of the electroplated first seed layer is in a range from about 5 µm to about 15 µm, the excess electroplated copper on a second surface is removed by using a chemical mechanical polishing (CMP) method, thereby forming the first connection electrodes 25 covering the inner walls of the corresponding first connection vias 11, respectively. Finally, a resin material is filled as the filling structure 26 in the first accommodation space defined in the first connection via 11, and the filling structure 26 prevents the first connection electrode 25 from being oxidized and acts as a support structure, as shown in FIGS. 10 and 11.

The auxiliary film layer serves to increase the adhesion of the first conductive film layer. A material of the auxiliary film layer includes, but is not limited to, titanium Ti, and a material of the first conductive film layer includes, but is not limited to, Cu. A thickness of the auxiliary film layer is in a range from about 10 nm to about 300 nm, and a thickness of the first conductive film layer is in a range from about 30 nm to about 100 nm.

In the second example, the first connection electrodes 25 only covering the sidewalls of the first connection vias 11 are formed, so that the time for the electroplating process can be effectively shortened, the copper material can be saved, and the time and the manufacturing cost can be saved.

In a third example, the method for manufacturing a filter includes six steps, of which four steps and one step S36 in the third example may be the same as steps S11 to S14 and S17 in the first example, respectively, and another step S35 is substantially the same as step S25, with a slight difference. Only step S35 will be described below.

Figure 12:
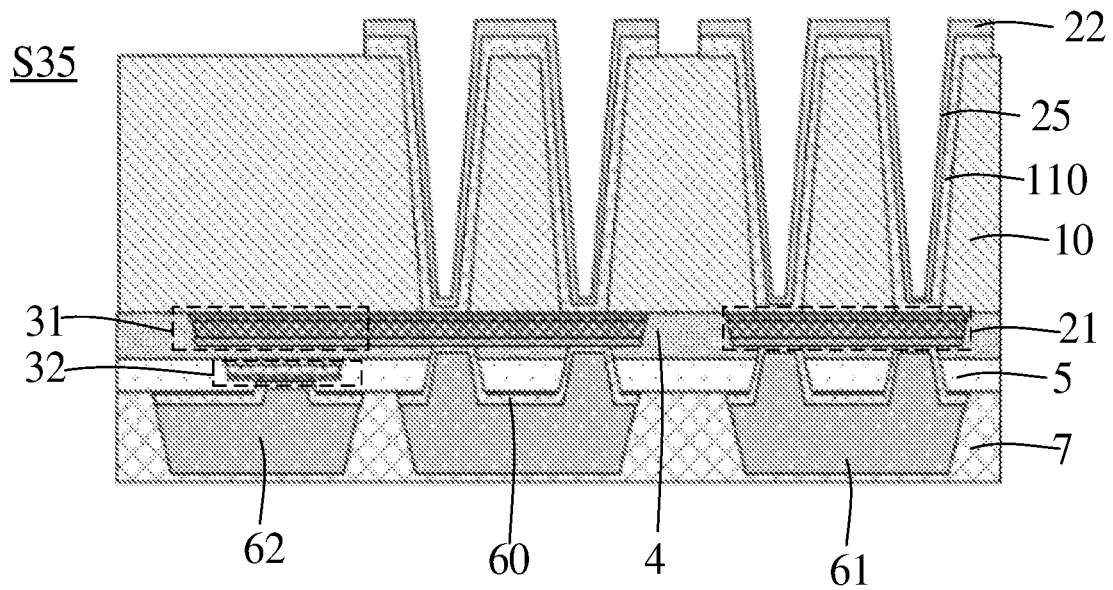
FIG. 12 is a schematic diagram of an intermediate product formed in step S35 of a third example of a method for manufacturing a filter according to an embodiment of the present disclosure.
Figure 13:
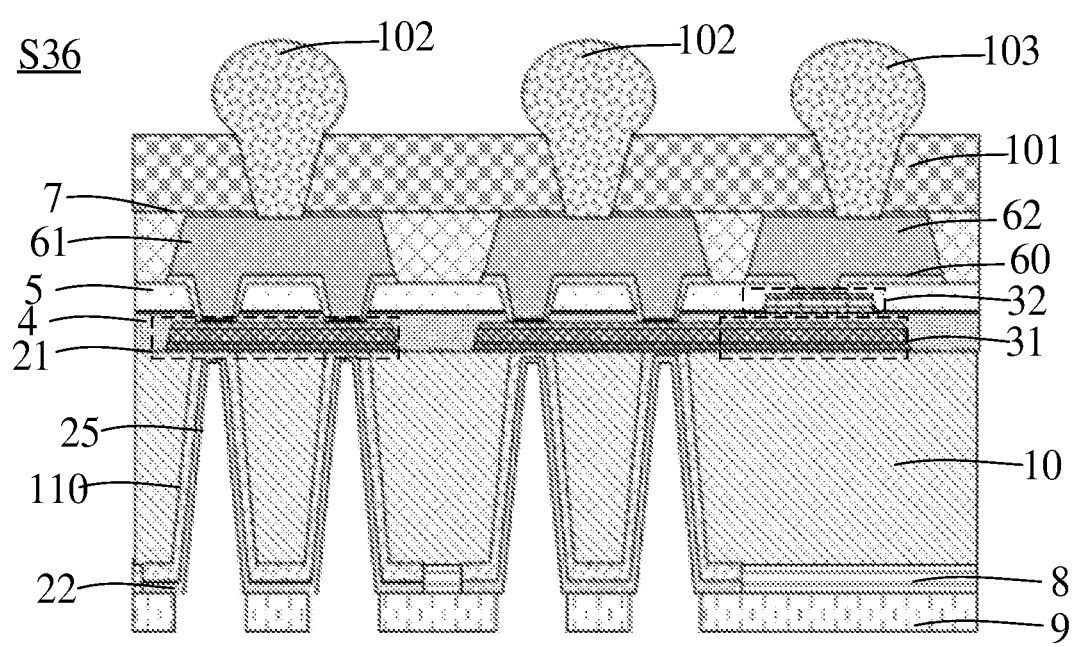
FIG. 13 is a schematic diagram of an intermediate product formed in step S36 of a third example of a method for manufacturing a filter according to an embodiment of the present disclosure.

The first connection electrodes 25 formed in step S35 are the same as those in step S25, that is, an auxiliary film layer 110 is formed through a process including, but not limited to, a magnetron sputtering process, and then the first conductive film layer is continuously sputtered, the first conductive film layer is used as a seed layer, the first seed layer is electroplated, and a thickness of the electroplated first seed layer is in a range from about 5 µm to about 15 µm; and step S35 differs from step S25 in that it is unnecessary to completely remove the electroplated second seed layer on the second surface of the first dielectric substrate 10, but the second seed layer on the second surface is patterned to form the second sub-structure 22 of the inductor, as shown in FIGS. 12 and 13.

It should be noted that in the embodiment of the present disclosure, a capacitance value is determined by the thickness of the first interlayer dielectric layer 4, the dielectric constant of the material of the first interlayer dielectric layer 4, and an area of the first plate 31 and the second plate 32 directly opposite to each other. An inductance value is determined by the number of turns of a spiral line, a pitch of the spiral line and a diameter of the spiral line. Therefore, the dielectric constant of the material of the first interlayer dielectric layer 4 of the capacitor, parameters of the first plate 31 and the second plate 32, the sizes, a distance and other parameters of the first sub-structures 21 and the second sub-structures 22 of the inductor coil may be reasonably designed, thereby realizing the effect of optimizing the filter circuit.

It should be understood that, the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A method for manufacturing a filter, comprising forming at least one inductor and at least one capacitor; wherein the forming the at least one inductor comprises:
   providing a first dielectric substrate; wherein the first dielectric substrate comprises a first surface and a second surface opposite to each other along a thickness direction of the first dielectric substrate;
   forming first sub-structures of each of the at least one inductor on the first surface of the first dielectric substrate;
   forming first connection vias penetrating through the first dielectric substrate in the thickness direction of the first dielectric substrate;
   forming first connection electrodes in the first connection vias; and
   forming second sub-structures of the at least one inductor on the second surface of the first dielectric substrate; wherein the first connection electrodes sequentially connects the first sub-structures and the second sub-structures through the first connection vias to form a coil structure of the at least one inductor,
   wherein a first plate of each of the at least one capacitor is formed while forming the first sub-structures of the at least one inductor,
   wherein the method further comprises:
   forming a first interlayer dielectric layer on a side of the first sub-structures of the at least one inductor and the first plate of the at least one capacitor away from the first dielectric substrate; and
   forming a pattern comprising a second plate of the at least one capacitor on a side of the first interlayer dielectric layer away from the first dielectric substrate through a patterning process.

2. The method according to claim 1, wherein the first dielectric substrate is processed by any one of a sand blast method, a photosensitive glass method, a focus discharge method, a plasma etching method, a laser ablation method, an electrochemical method or a laser induced etching method to form the first connection vias.

3. The method according to claim 1, wherein the forming the first connection electrodes in the first connection vias comprises:
   forming a first conductive film layer in the first connection vias as a first seed layer; and
   electroplating the first seed layer to form the first connection electrodes filled in the first connection vias.

4. The method according to claim 3, wherein the first seed layer covers the second surface of the first dielectric substrate; and after the electroplating the first seed layer to form the first connection electrodes filled in the first connection vias, the method further comprises:
   patterning the electroplated first seed layer on the second surface to form the second sub-structures.

5. The method according to claim 1, wherein the forming the first connection electrodes in the first connection vias comprises:
   forming a first conductive film layer in the first connection vias as a first seed layer; and
   electroplating the first seed layer to form the first connection electrodes covering inner walls of the first connection vias; wherein the first connection electrodes cover the inner walls of the first connection vias to define first accommodation spaces.

6. The method according to claim 5, wherein before the forming second sub-structures of the at least one inductor on the second surface of the first dielectric substrate, the method further comprises:
   forming filling structures to fill the first accommodation spaces, respectively.

7. The method according to claim 5, wherein the first seed layer covers the second surface of the first dielectric substrate; and after the electroplating the first seed layer to form the first connection electrodes filled in the first connection vias, the method further comprises:
   patterning the electroplated first seed layer on the second surface to form the second sub-structures.

8. The method according to claim 1, wherein the forming the second sub-structures of the at least one inductor on the second surface of the first dielectric substrate comprises:
   forming a second conductive film layer on the second surface of the first dielectric substrate as a second seed layer;
   electroplating the second seed layer to increase a thickness of the second conductive film layer; and
   patterning the electroplated second seed layer to form the second sub-structures.

9. The method according to claim 1, wherein the forming the first sub-structures of the at least one inductor on the first surface of the first dielectric substrate comprises:
   sequentially depositing a first film layer, a second film layer and a third film layer on the first surface of the first dielectric substrate, and forming the first sub-structures through a patterning process such that the first sub-structure comprises a first portion, a second portion and a third portion stacked sequentially.

10. The method according to claim 1, wherein a distance between every two adjacent first connection vias is not less than twice a diameter of each first connection via.

11. The method according to claim 1, wherein the forming the pattern comprising the second plate of the at least one capacitor on a side of the first interlayer dielectric layer away from the first dielectric substrate through the patterning process comprises:
   sequentially depositing a fourth film layer, a fifth film layer and a sixth film layer on a side of the first interlayer dielectric layer away from the first dielectric substrate, and forming the second plate of the at least one capacitor through the patterning process such that the second plate comprises a seventh portion, an eighth portion and a ninth portion stacked sequentially.

12. The method according to claim 1, further comprising:
   forming a second interlayer dielectric layer on a side of the second plate of the at least one capacitor away from the first dielectric substrate, and forming a second connection via penetrating through the first interlayer dielectric layer and the second interlayer dielectric layer and a third connection via penetrating through the second interlayer dielectric layer; and
   forming a second connection electrode and a third connection electrode on a side of the second interlayer dielectric layer away from the first dielectric substrate, through a patterning process; wherein the second connection electrode is connected to a lead terminal of the at least one inductor through the second connection via, and the third connection electrode is electrically connected to the second plate of the at least one capacitor through the third connection via.

13. The method according to claim 12, further comprising:
sequentially forming a first protective layer and a first planarization layer on a side of the second connection electrode and the third connection electrode away from the first dielectric substrate;
forming a fourth connection via and a fifth connection via penetrating through the first protective layer and the first planarization layer; and
forming a first connection pad and a second connection pad; wherein the first connection pad is connected to the second connection electrode through the fourth connection via, and the second connection pad is connected to the third connection electrode through the fifth connection via.

14. The method according to claim 13, wherein the first planarization layer, the fourth connection via, the fifth connection via, the first connection pad, and the second connection pad are all formed after the second sub-structures of the at least one inductor are formed.

15. The method according to claim 1, further comprising:
sequentially forming a second protective layer and a second planarization layer on a side of the second sub-structures away from the first dielectric substrate.

16. A filter, comprising at least one inductor and at least one capacitor; wherein the filter comprises:
a first dielectric substrate; wherein the first dielectric substrate comprises a first surface and a second surface opposite to each other along a thickness direction of the first dielectric substrate;
first sub-structures of each of the at least one inductor on the first surface of the first dielectric substrate;
first connection vias penetrating through the first dielectric substrate in the thickness direction of the first dielectric substrate;
first connection electrodes in the first connection vias; and
second sub-structures of the at least one inductor on the second surface of the first dielectric substrate; wherein the first connection electrodes sequentially connects the first sub-structures and the second sub-structures through the first connection vias to form a coil structure of the at least one inductor,
wherein each of the at least one capacitor comprises a first plate,
wherein the filter further comprises:
a first interlayer dielectric layer on a side of the first sub-structures of the at least one inductor and the first plate of the at least one capacitor away from the first dielectric substrate; and
a second plate of the at least one capacitor on a side of the first interlayer dielectric layer away from the first dielectric substrate.

* * * * *